(12) United States Patent
Gao

(10) Patent No.: US 10,925,190 B2
(45) Date of Patent: Feb. 16, 2021

(54) LEAK DETECTION AND RESPONSE SYSTEM FOR LIQUID COOLING OF ELECTRONIC RACKS OF A DATA CENTER

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 15/997,428

(22) Filed: Jun. 4, 2018

(65) Prior Publication Data

US 2019/0373776 A1 Dec. 5, 2019

(51) Int. Cl.
*H05K 7/20* (2006.01)
*H05K 7/14* (2006.01)

(52) U.S. Cl.
CPC ....... *H05K 7/20836* (2013.01); *H05K 7/1489* (2013.01); *H05K 7/20254* (2013.01); *H05K 7/20272* (2013.01); *H05K 7/20727* (2013.01); *H05K 7/20772* (2013.01); *H05K 7/20781* (2013.01)

(58) Field of Classification Search
CPC ........... H05K 7/20836; H05K 7/20254; H05K 7/20772; H05K 7/20781; H05K 7/1489; H05K 7/20272; H05K 7/20727; H05K 7/20281; H05K 7/20218; H05K 7/20627; H05K 7/20645; G06F 1/206; G06F 2200/201
USPC .................................... 361/679.53, 698, 702
See application file for complete search history.

(56) References Cited

U.S. PATENT DOCUMENTS

| 2005/0247433 A1* | 11/2005 | Corrado .................... G06F 1/20 165/80.4 |
| 2009/0219681 A1* | 9/2009 | Goth ....................... F25B 49/02 361/679.53 |
| 2011/0060470 A1* | 3/2011 | Campbell .......... H05K 7/20836 700/282 |
| 2011/0313576 A1* | 12/2011 | Nicewonger ........... F28D 15/00 700/282 |

(Continued)

FOREIGN PATENT DOCUMENTS

| CN | 104054407 | 9/2014 |
| CN | 105472943 | 4/2016 |

(Continued)

*Primary Examiner* — Stephen S Sul
(74) *Attorney, Agent, or Firm* — Womble Bond Dickinson (US) LLP

(57) ABSTRACT

An electronic rack includes a rack manifold having a rack liquid supply line and a rack liquid return line, and server blades arranged in a stack. Each server blade includes cold plates and a server liquid distribution loop, and a leak detector configured to detect leaking of the cooling liquid distributed to the server blade. The electronic rack further includes server FCDs corresponding to the server blades and an RMC unit coupled to the server FCDs and leak detectors of the server blades. In one embodiment, in response to a signal received from a first leak detector of the first server blade indicating that there is a leak within the first server blade, the RMC unit is configured to transmit a control signal to the first server FCD to reduce an amount of cooling liquid to be distributed to the first server blade or bypass the liquid completely.

18 Claims, 6 Drawing Sheets

(56) References Cited

U.S. PATENT DOCUMENTS

| | | | | |
|---|---|---|---|---|
| 2012/0111037 | A1* | 5/2012 | Campbell | F25B 49/02 |
| | | | | 62/115 |
| 2013/0205822 | A1* | 8/2013 | Heiland | H05K 7/2079 |
| | | | | 62/259.2 |
| 2014/0124190 | A1* | 5/2014 | Campbell | F28F 27/02 |
| | | | | 165/296 |
| 2014/0238065 | A1* | 8/2014 | Bonnin | H05K 7/20218 |
| | | | | 62/259.2 |
| 2015/0334878 | A1* | 11/2015 | Long | H05K 7/20745 |
| | | | | 361/679.49 |
| 2016/0091262 | A1* | 3/2016 | Chainer | H05K 7/20272 |
| | | | | 165/104.31 |
| 2016/0242318 | A1* | 8/2016 | Krug, Jr. | H05K 7/20772 |
| 2016/0242319 | A1* | 8/2016 | Edwards | H05K 7/20781 |
| 2016/0270259 | A1* | 9/2016 | Chainer | H05K 7/20272 |
| 2016/0270267 | A1* | 9/2016 | Chainer | H05K 7/20781 |
| 2017/0177041 | A1* | 6/2017 | Shelnutt | G06F 1/20 |
| 2017/0181324 | A1* | 6/2017 | Shelnutt | H05K 7/20781 |
| 2017/0181326 | A1* | 6/2017 | Shelnutt | G05D 7/0629 |
| 2017/0181327 | A1* | 6/2017 | Shelnutt | H05K 7/20836 |
| 2017/0181328 | A1* | 6/2017 | Shelnutt | H05K 7/20781 |
| 2017/0181329 | A1* | 6/2017 | Shelnutt | H05K 7/20763 |
| 2018/0084676 | A1 | 3/2018 | Edwards et al. | |
| 2018/0100709 | A1* | 4/2018 | Gopal | F28D 20/02 |

FOREIGN PATENT DOCUMENTS

| | | |
|---|---|---|
| CN | 107069142 | 8/2017 |
| CN | 107580804 | 1/2018 |
| CN | 207382771 | 5/2018 |

* cited by examiner

LEAK DETECTION AND RESPONSE SYSTEM FOR LIQUID COOLING OF ELECTRONIC RACKS OF A DATA CENTER

FIELD OF THE INVENTION

Embodiments of the present invention relate generally to data centers. More particularly, embodiments of the invention relate to a liquid distribution unit design for liquid cooling of electronic racks in data centers.

BACKGROUND

Heat removal is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient heat removal solutions especially in the cases of cooling these high performance servers.

Power intensive processors enable the solution of intensive computing such as deep learning. Electrical servers having those processors, i.e., high-power central processing units (CPUs) and/or general-purpose or graphical processing units (GPUs), have a very high power density per volumetric space. Liquid cooling is a proper thermal management solution for high power density.

In liquid cooling, a manifold is used for distributing and regulating fluid with main inlet/outlet ports and fluid sub-ports. The main inlet and outlet ports are connected to external cooling source, and the sub ports are connected with either server loops or cooling device loops. The fluid distribution manifold is a mature technology; however, most of the conventional manifold designs are not efficient in some application scenarios.

Before the liquid cooling can be applied as a mature solution and deployed in scale in data centers, one of the major challenges is reliability. The reliability issue is the leak of fluid. There are multiple methods for improving the liquid cooling system reliability, such as improving product quality, developing components test procedures and criteria (hoses connectors, manifold, etc.), fluid selection standard, material selection standard and so on. However, a leak may still happen often and there have been a lack of efficient mechanism to reduce the risks of liquid leak.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
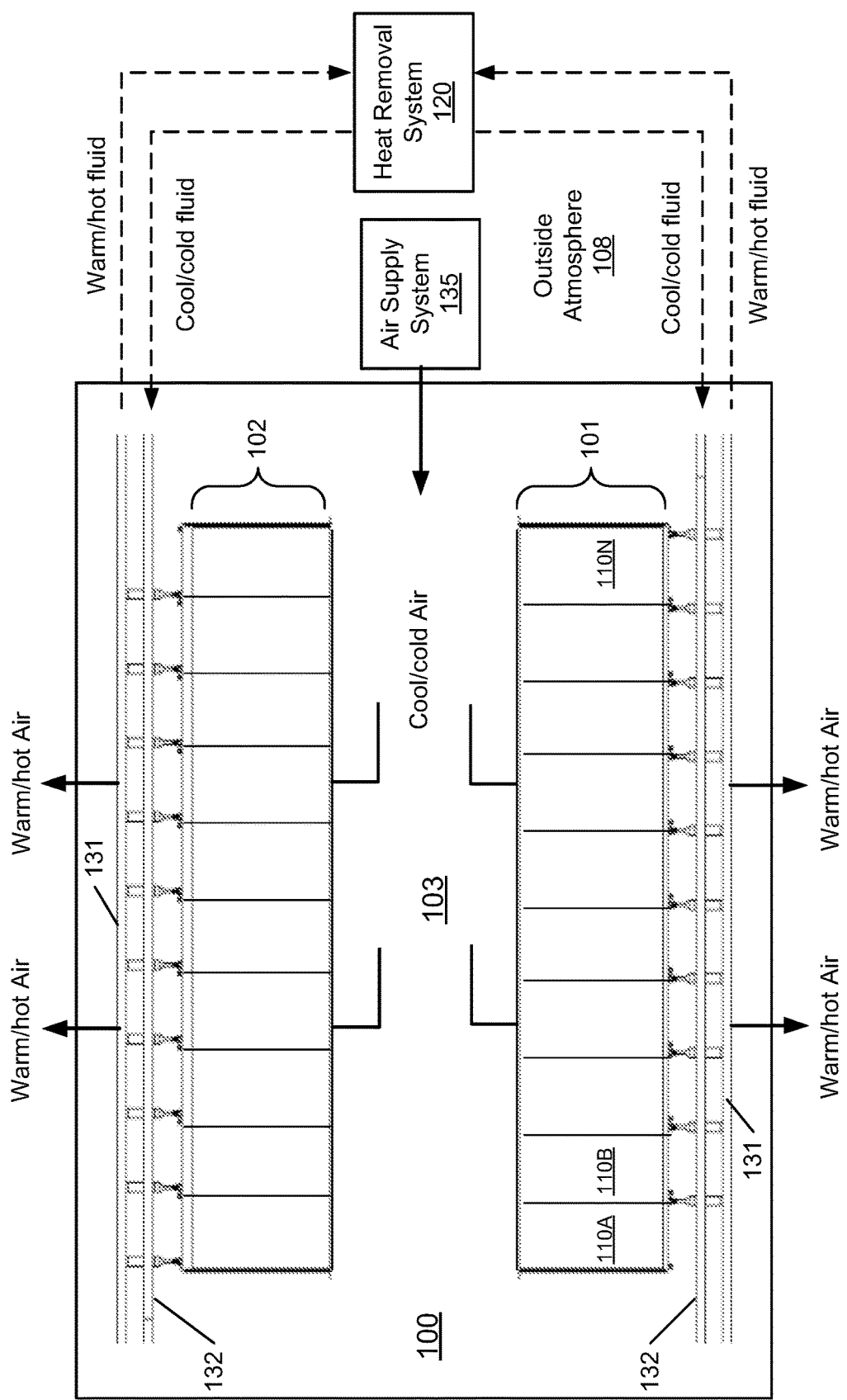
FIG. 1 is a block diagram illustrating an example of a data center facility according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments of the invention focus on the leak response design for server liquid cooling. It provides a basic concept of liquid leak responses, including the mechanical and thermal design, control design as well as the information technology (IT) response design. Basically, the concept is to shut down or divert the fluid supplied to the cooling loop or cooling module which has the leak by using a bypass loop. The function of the bypass loop is to bypass the cooling loops/cooling modules. The bypass mechanism can be implemented at a rack level and/or a server level.

According to one aspect of the invention, an electronic rack includes a rack manifold having a rack liquid supply line and a rack liquid return line. The rack liquid supply line is configured to receive cooling liquid from a cooling liquid source. The rack liquid return line is configured to return warmer liquid back to the cooling liquid source, carrying the heat exchanged from the servers of the electronic rack. The electronic rack further includes a number of server blades arranged in a stack. Each of the server blades includes one or more cold plates associated with one or more IT components (e.g., processors, memory, and/or storage devices) and a server liquid distribution loop to receive the cooling liquid from the rack manifold and to distribute the cooling liquid to the cold plates to exchange the heat generated from the IT components. Each server blade further includes a leak detector configured to detect leaking of the cooling liquid distributed to the server blade.

The electronic rack further includes a number of pairs of server liquid supply lines and server liquid return lines. Each pair of server liquid supply line and server liquid return line corresponds to one of the server blades. The server liquid supply lines and the server liquid return lines are coupled between the rack manifold and the server liquid distribution loops of the server blades. The electronic rack further includes a number of server flow control devices (FCDs) corresponding to the server blades. Each server FCD is coupled to one of the pairs of server liquid supply lines and the server liquid return lines, including a first server FCD coupled to a first pair of a server liquid supply line and a server liquid return line of a first server blade. The electronic rack further includes a rack management controller (RMC) unit coupled to the server FCDs and leak detectors of the server blades. In one embodiment, in response to a signal received from a first leak detector of the first server blade indicating that there is a leak within the first server blade, the RMC unit is configured to transmit a control signal to the first server FCD to reduce an amount of cooling liquid to be distributed to the first server blade. In one embodiment, when there is liquid leak detected, the FCD may completely shut off the supply line to the server blade.

According to one embodiment, the first server FCD is configured to block substantially all cooling liquid from being distributed to the first liquid distribution loop of the first server blade. In a particular embodiment, the first server FCD is configured to divert or reroute via a bypass path or route the cooling liquid from the server supply line to the server return line of the first server blade, bypassing the liquid distribution loop of the first server blade.

According to another embodiment, each server blade further includes at least a liquid pressure sensor, disposed either on the server liquid supply line, server liquid return line, or both, to sense the liquid pressure flowing within the server blade. If the liquid pressure drops below a predetermined threshold, it means there may be liquid leak within the server blade. In response to the signal received from the pressure sensor, the RMC unit is configured to activate the server FCD to block at least a significant or substantial amount of the cooling liquid from being distributed to the server blade or divert at least a significant or substantial amount of the cooling liquid using a bypass mechanism.

According to another embodiment, a rack FCD is coupled to the rack liquid supply line. The rack FCD is configured to control an amount of cooling liquid to be distributed to the server blades. In response to a signal received from the RMC unit indicating there is liquid leak within at least one of the server blades, the rack FCD is activated to either block or divert at least a substantial amount of the cooling liquid, which reduces substantial amount of cooling liquid entering the server blades. According to a further embodiment, a liquid pressure sensor may be coupled to the rack liquid supply line and/or rack liquid return line to sense the liquid pressure at a rack level. If the rack liquid pressure drops below a predetermined threshold, it means there may be liquid leaking within at least one of the server blades. In response, the RMC unit can activate the rack FCD to reduce at least a significant or substantial amount of cooling liquid from being distributed to the server blades.

According to another aspect of the invention, an electronic rack includes a rack manifold having a rack liquid supply line and a rack liquid return line. The rack liquid supply line is to receive cooling liquid from a cooling liquid source and the rack liquid return line returns the warmer liquid back to the cooling liquid source, carrying the exchanged heat. The electronic rack includes a number of server blades arranged in a stack. Each server blade includes one or more cold plates associated with one or more IT components and a server liquid distribution loop to receive and distribute the cooling liquid to the cold plates to exchange the heat generated from the IT components, which in turn transforms the cooling liquid into warmer liquid. At least one of the server blades includes a leak detector to detect the possible liquid leaking. The electronic rack further includes a rack FCD coupled to at least the rack liquid supply line and an RMC unit coupled to the rack FCD and the leak detectors of the server blades. In response to a signal received from a liquid leak detector, the RMC unit sends a command to the rack FCD to reduce the amount of cooling liquid flowing into the server blades, or shut off the fluid completely.

According to one embodiment, the rack FCD is configured to substantially block all of the cooling liquid from being entering the liquid distribution loops of the server blades. Alternatively, the rack FCD is configured to divert at least a significant or substantial amount of the cooling liquid from the rack liquid supply line to the rack liquid return line, bypassing the server blades. According to another embodiment, the electronic rack further includes a rack liquid pressure sensor disposed on the rack liquid supply line or the rack liquid return line to sense the liquid pressure flowing within the rack liquid supply line or the rack liquid return line. In response to a signal received from the rack liquid pressure sensor indicating that the liquid pressure drops below a predetermined threshold, the RMC unit is configured to activate the rack FCD to reduce the amount of cooling liquid entering the server blades.

According to a further embodiment, each server blade includes a server FCD coupled to at least the server liquid supply line, which when activated, is configured to reduce the amount of cooling liquid entering the corresponding server blade. The server FCD can simply be a valve to substantially shut or block the liquid from entering the server blade. Alternatively, the server FCD when activated can divert most or all of the cooling liquid from the server liquid supply line to the server liquid return line, bypassing the liquid distribution loop of the server blade.

FIG. 1 is a block diagram illustrating an example of a data center or data center unit according to one embodiment. In this example, FIG. 1 shows a top view of at least a portion of a data center. Referring to FIG. 1, according to one embodiment, data center system 100 includes rows of electronic racks of information technology (IT) components, equipment or instruments 101-102, such as, for example, computer servers or computing nodes that provide data services to a variety of clients over a network (e.g., the Internet). In this embodiment, each row includes an array of electronic racks such as electronic racks 110A-110N. However, more or fewer rows of electronic racks may be implemented. Typically, rows 101-102 are aligned in parallel with frontends facing towards each other and backends facing away from each other, forming aisle 103 in between to allow an administrative person walking therein. However, other configurations or arrangements may also be applied.

In one embodiment, each of the electronic racks (e.g., electronic racks 110A-110N) includes a housing to house a number of electronic racks of IT components operating therein. The electronic racks can include a heat removal liquid manifold, a number of server slots, and a number of server blades capable of being inserted into and removed from the server blades or server slots. Each server blade represents a computing node having one or more processors, a memory, and/or a persistent storage device (e.g., hard disk). At least one of the processors is attached to a liquid cold plate (also referred to as a cold plate assembly) to receive cooling liquid. In addition, one or more optional cooling fans are associated with the server blades to provide air cooling to the computing nodes contained therein. Note that the heat removal system 120 may be coupled to multiple data center systems such as data center system 100. The heat removal system removes a substantial amount of the heat generated within the data centers to the atmosphere.

In one embodiment, heat removal system 120 includes an external liquid loop connected to a cooling tower or a dry cooler external to the building/housing container. The heat removal system 120 can include, but is not limited to evaporative cooling, free air, and rejection to large thermal mass and waste heat recovery designs. Heat removal system 120 may include or be coupled to a cooling liquid source that provide cooling liquid.

In one embodiment, each server blade is coupled to the heat removal liquid manifold modularly such that a server blade can be removed from the electronic rack without affecting the operations of remaining server blades on the electronic rack and the heat removal liquid manifold. In another embodiment, each server blade is coupled to the heat removal liquid manifold (also referred to as a cooling liquid manifold) through a quick-release coupling assembly having a first liquid intake connector and a first liquid outlet connector coupled to a flexible hose to distribute the heat removal liquid to the processors. The first liquid intake connector is to receive heat removal liquid via a second liquid intake connector from a heat removal liquid manifold mounted on a backend of the electronic rack. The first liquid outlet connector is to emit warmer or hotter liquid carrying the heat exchanged from the processors to the heat removal liquid manifold via a second liquid outlet connector and then back to a coolant distribution unit (CDU) within the electronic rack.

In one embodiment, the heat removal liquid manifold disposed on the backend of each electronic rack is coupled to liquid supply line 132 to receive heat removal liquid (also referred to as cooling liquid) from heat removal system 120. The heat removal liquid is distributed through a liquid distribution loop attached to a cold plate assembly on which a processor is mounted to remove heat from the processors. A cold plate is configured similar to a heat sink with a liquid distribution tube attached or embedded therein. The resulting warmer or hotter liquid carrying the heat exchanged from the processors is transmitted via liquid return line 131 back to heat removal system 120. Liquid supply/return lines 131-132 are referred to as data center or room liquid supply/return lines (e.g., global liquid supply/return lines), which supply heat removal liquid to all of the electronic racks of rows 101-102. The liquid supply line 132 and liquid return line 131 are coupled to a heat exchanger of a CDU located within each of the electronic racks, forming a primary loop. The secondary loop of the heat exchanger is coupled to each of the server blades in the electronic rack to deliver the cooling liquid to the cold plates of the processors.

In one embodiment, data center system 100 further includes an optional airflow delivery system 135 to generate an airflow to cause the airflow to travel through the air space of the server blades of the electronic racks to exchange heat generated by the computing nodes due to operations of the computing nodes (e.g., servers) and to exhaust the airflow exchanged heat to an external environment 108 outside of housing/room/building. For example, air supply system 135 generates airflow of cool/cold air to circulate from aisle 103 through electronic racks 110A-110N to carry away exchanged heat. The cool airflows enter the electronic racks through their frontends and the warm/hot airflows exit the electronic racks from their backends. The warm/hot air with exchanged heat is exhausted from room/building. Thus, the cooling system is a hybrid liquid-air cooling system, where a portion of the heat generated by a processor is removed by cooling liquid via the corresponding cold plate, while the remaining portion of the heat generated by the processor (or other electronics or processing devices) is removed by airflow cooling. Air supply system 135 can be connected to the heat removal system 120 to extracted the heat to the atmosphere.

Figure 2:
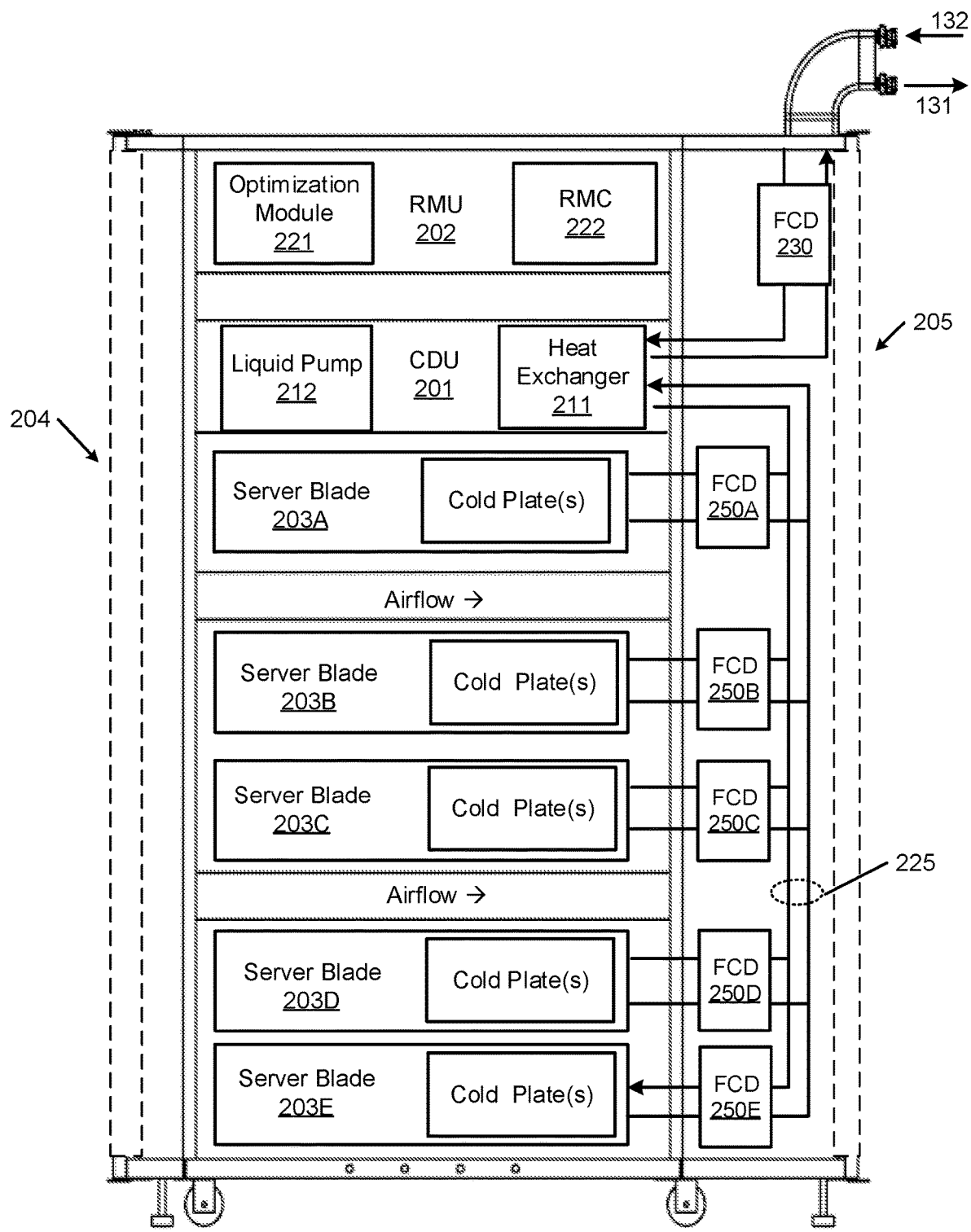
FIG. 2 is a block diagram illustrating an example of an electronic rack according to one embodiment.

FIG. 2 is block diagram illustrating an electronic rack according to one embodiment. Electronic rack 200 may represent any of the electronic racks as shown in FIG. 1, such as, for example, electronic racks 110A-110N. Referring to FIG. 2, according to one embodiment, electronic rack 200 includes, but is not limited to, optional CDU 201, RMU 202, and one or more server blades 203A-203E (collectively referred to as server blades 203). Server blades 203 can be inserted into an array of server slots respectively from frontend 204 or backend 205 of electronic rack 200. Note that although there are five server blades 203A-203E shown here, more or fewer server blades may be maintained within electronic rack 200. Also note that the particular positions of CDU 201, RMU 702, and server blades 203 are shown for the purpose of illustration only; other arrangements or configurations of CDU 201, RMU 202, and server blades 203 may also be implemented. In one embodiment, electronic rack 200 can be either open to the environment or partially contained by a rack container, as long as the cooling fans can generate airflows from the frontend to the backend.

In addition, for at least some of the server blades 203, an optional fan module (not shown) is associated with the server blade. Each of the fan modules includes one or more cooling fans. The fan modules may be mounted on the backends of server blades 203 or on the electronic rack to generate airflows flowing from frontend 204, traveling through the air space of the sever blades 203, and existing at backend 205 of electronic rack 200.

In one embodiment, CDU 201 mainly includes heat exchanger 211, liquid pump 212, and a pump controller (not shown), and some other components such as a liquid reservoir, a power supply, monitoring sensors and so on. Heat exchanger 211 may be a liquid-to-liquid heat exchanger. Heat exchanger 211 includes a first loop with inlet and outlet ports having a first pair of liquid connectors coupled to external liquid supply/return lines 131-132 to form a primary loop. The connectors coupled to the external liquid supply/return lines 131-132 may be disposed or mounted on backend 205 of electronic rack 200. The liquid supply/return lines 131-132, also referred to as room liquid supply/return lines, are coupled to heat removal system 120 as described above. In addition, heat exchanger 211 further includes a second loop with two ports having a second pair of liquid connectors coupled to liquid manifold 225 to form a secondary loop, which may include a supply manifold (also referred to as a rack liquid supply line) to supply cooling liquid to server blades 203 and a return manifold (also referred to as a rack liquid return line) to return warmer liquid back to CDU 201. Note that CDUs 201 can be any kind of CDUs commercially available or customized ones. Thus, the details of CDUs 201 will not be described herein.

Each of server blades 203 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. Server blades 203 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

Electronic rack 200 further includes RMU 202 configured to provide and manage power supplied to servers 203 and CDU 201. RMU 202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.,) to provide power to the rest of the components of electronic rack 200.

In one embodiment, RMU 202 includes optimization module 221 and rack management controller (RMC) 222. RMC 222 may include a monitor to monitor operating status of various components within electronic rack 200, such as, for example, computing nodes 203, CDU 201, and the fan modules. Specifically, the monitor receives operating data from various sensors representing the operating environments of electronic rack 200. For example, the monitor may receive operating data representing temperatures of the processors, cooling liquid, and air temperatures, which may be captured and collected via various temperature sensors. The monitor may also receive data representing the fan power and pump power generated by the fan modules and liquid pump 212, which may be proportional to their respective speeds. These operating data are referred to as real-time operating data. Further, the monitor may further receive signals indicating whether liquid leak occurs in any of the server blades, for example from leak detectors and/or sensors (e.g., liquid sensors, temperature sensors). Note that the monitor may be implemented as a separate module within RMU 202.

Based on the operating data, optimization module 221 performs an optimization using a predetermined optimization function or optimization model to derive a set of optimal fan speeds for fan modules and an optimal pump speed for liquid pump 212, such that the total power consumption of liquid pump 212 and the fan modules reaches minimum, while the operating data associated with liquid pump 212 and cooling fans of the fan modules are within their respective designed specifications. Once the optimal pump speed and optimal fan speeds have been determined, RMC 222 configures liquid pump 212 and cooling fans of fan modules 231 based on the optimal pump speeds and fan speeds.

As an example, based on the optimal pump speed, RMC 222 communicates with a pump controller of CDU 201 to control the speed of liquid pump 212, which in turn controls a liquid flow rate of cooling liquid supplied to the liquid manifold 225 to be distributed to at least some of server blades 203. Similarly, based on the optimal fan speeds, RMC 222 communicates with each of the fan modules to control the speed of each cooling fan of the fan modules, which in turn control the airflow rates of the fan modules. Note that each of fan modules may be individually controlled with its specific optimal fan speed, and different fan modules and/or different cooling fans within the same fan module may have different optimal fan speeds.

Figure 3:
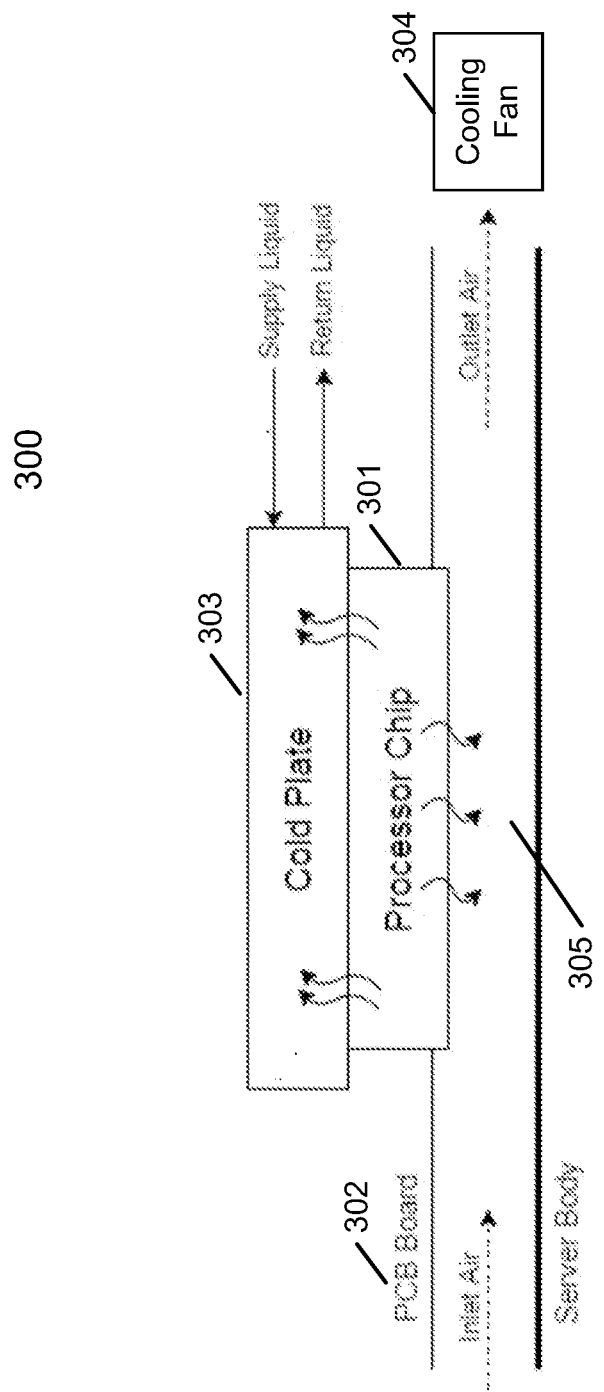
FIG. 3 is a block diagram illustrating an example of a cold plate configuration according to one embodiment.

FIG. 3 is a block diagram illustrating a processor cold plate configuration according to one embodiment. The processor/cold plate structure 300 can represent any of the processors/cold plate structures of server blades 203 as shown in FIG. 2. Referring to FIG. 3, processor 301 is plugged onto a processor socket mounted on printed circuit board (PCB) or motherboard 302 coupled to other electrical components or circuits of a data processing system or server. Processor 301 also includes a cold plate 303 attached to it, which is coupled to liquid supply line 132 and liquid return line 131. A portion of the heat generated by processor 301 is removed by the cooling liquid via cold plate 303. The remaining portion of the heat enters into air space 305 underneath, which may be removed by an airflow generated by cooling fan 304.

Referring back to FIG. 2, according to one embodiment, electronic rack 200 includes a rack FCD 230 coupled to RMU 202 and at least the rack liquid supply line and/or the rack liquid return line to control the amount of cooling liquid flowing to the sever blades 203. Each of the server blades 203 further includes a leak detector (not shown) to detect liquid leak within the server blade. A leak detector can be any liquid leak detectors. In one embodiment, in response to a signal received from a leak detector of a server blade, RMC 222 is configured to send a command to rack FCD 230 to reduce the amount of cooling liquid to reach server blades 203. Rack FCD 230 can be simply a valve or switch, which is configured to a first position, the cooling liquid is allowed to flow through the rack manifold 225 to reach server blades 203. When rack FCD 230 is configured to a second position, the cooling liquid is substantially blocked. According to another embodiment, in response to a signal indicating there is liquid leaking within at least one of the server blades 203, RMC 222 activates rack FCD 230 to divert the cooling liquid from a rack liquid supply line (coupled to room supply line 132) to a rack liquid return line (coupled to room return line 131), bypassing server blades 203.

According to another embodiment, each of the server blades 203 includes or is associated with a server FCD such as server FCDs 250A-250E (collectively referred to as server FCDs 250) between rack manifold 225 and server blades 203. Each of the server FCD 250 is configured to control the flow volume of cooling liquid flowing into the sever blades 203. As described above, each server blade includes a server liquid supply line coupled to the rack supply line and a server liquid return line coupled to the rack return line. The server liquid supply line is coupled to one end of the server liquid distribution loop and the server liquid return line is coupled to the other end of the server liquid distribution loop, such that the cooling liquid is looping through the distribution loop for heat exchange. Each of server FCDs is coupled to RMC 222 and can be controlled by RMC 222.

In one embodiment, in response to a signal received from a leak detector of a particular server blade indicating that there is liquid leak within the server blade, RMC 222 controls the corresponding server FCD to reduce the amount of cooling liquid to be distributed to server blades 203. In one embodiment, a sever FCD is configured to substantially or completely shut off the liquid supplied to the sever blade. Alternatively, the server FCD diverts the cooling liquid from the server supply line to the server return line, bypassing the liquid distribution loop of the server blade.

According to another embodiment, in addition to or in lieu of a leak detector, a liquid pressure sensor can be used to detect whether there is liquid leak. When there is liquid leak, the leak more likely causes the liquid pressure to drop. A liquid pressure sensor, referred to as a rack pressure sensor, can be placed on rack manifold 225 to detect the liquid pressure on the rack manifold. Alternatively, a liquid pressure sensor, referred to as a server pressure sensor, can be placed on the server supply line and/or server return line to sense the liquid pressure flowing into the liquid distribution line of the server blade. The rack pressure sensor can detect the liquid leak within the rack at a rack level, while a server pressure sensor can detect liquid leak within a particular server blade at a server level. Alternatively, temperature sensors may also be placed in various locations (e.g., attached to the cold plates) to detect whether there is liquid leak. When the temperature arises above a predetermined threshold, or presents unnormal readings, a possible liquid leak may occur.

Figure 4A:
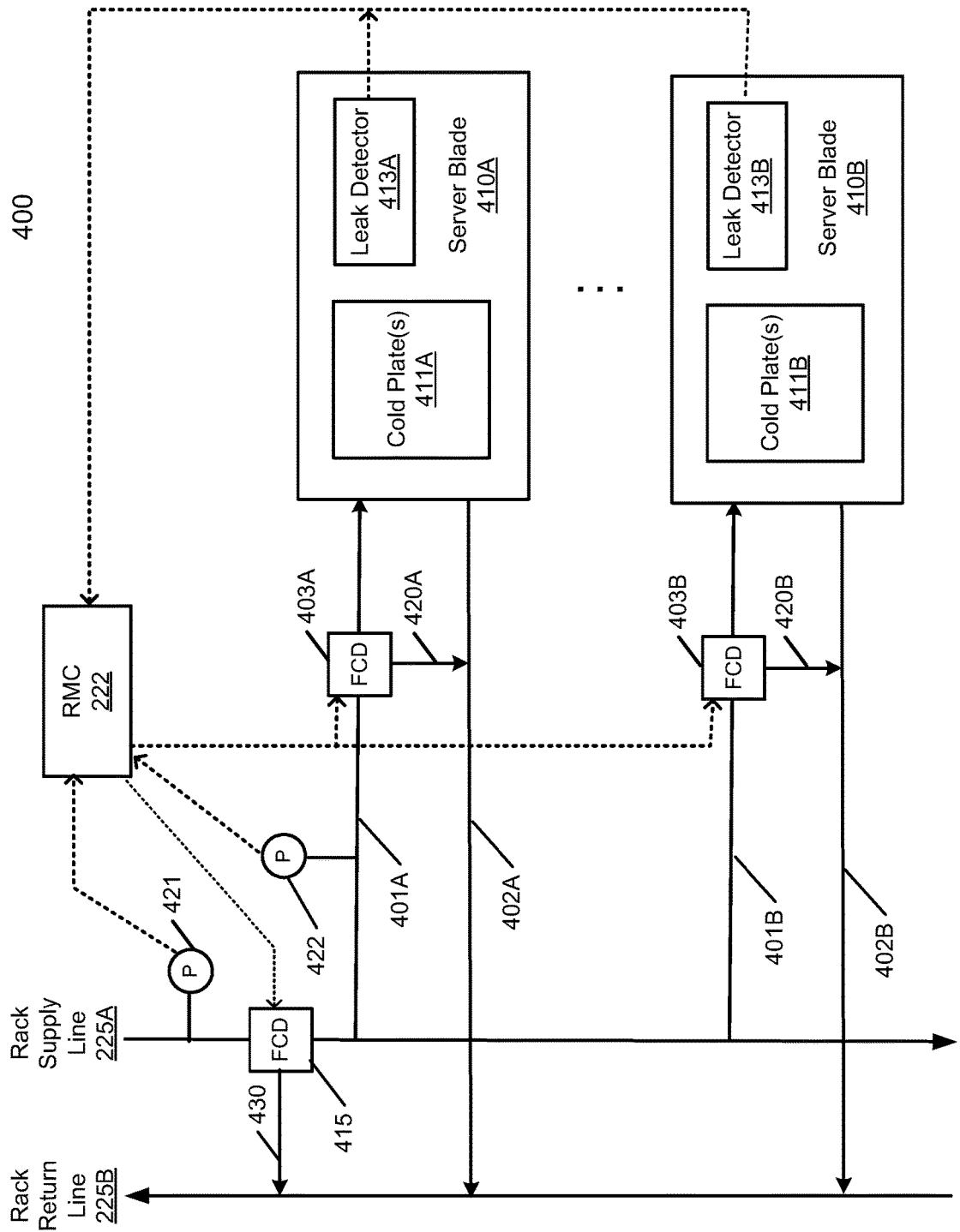
FIGS. 4A-4B are block diagrams illustrating examples of electronic racks according to certain embodiments.

FIG. 4A is a block diagram illustrating an electronic rack according to one embodiment. Electronic rack 400 may represent electronic rack 200 of FIG. 2. Referring to FIG. 4A, electronic rack 400 includes an array of server blades 410A-410B arranged in a stack, collectively referred to as server blades 410. Electronic rack 400 further includes a rack manifold having a rack liquid supply line 225A and a rack liquid return line 225B. Rack liquid supply line 225A is configured to receive cooling liquid from an external cooling liquid source and distribute the cooling liquid to each of the server blades 410. Rack liquid return line 225B is configured to return warmer liquid carrying the heat exchanged from the IT components of server blades 410 back to the cooling liquid source.

According to one embodiment, each of server blades 410 includes one or more IT components attached to one or more cold plates such as cold plates 411A-411B (collectively referred to as cold plates 411). Each cold plate is attached to a server liquid distribution loop having cooling liquid flowing therein (not shown). A cold plate is configured similar to a heat sink with a liquid distribution tube attached or embedded therein. The resulting warmer or hotter liquid carrying the heat exchanged from the IT components (e.g., processors). In one embodiment, a first end of a server liquid distribution loop is coupled to a server liquid supply line (e.g., server liquid supply lines 401A-401B), which is then coupled to rack liquid supply line 225A. A second end of the server liquid distribution loop is coupled to a server liquid return line (e.g., server liquid return lines 402A-402B), which is then coupled to rack liquid return line 225B. Each server blade receives the cooling liquid from rack liquid supply line 225A via its corresponding server liquid supply line. Each server blade returns the warmer liquid carrying the exchanged heat back to rack liquid return line 225B via its server liquid return line.

According to one embodiment, each server blade further includes a liquid leak detector such as leak detectors 413A-413B (collectively referred to as leak detectors 413). A leak detector can be any kind of leak detectors such as sensors and/or mechanical structures that are configured to detect any liquid leak from a liquid distribution line. Each leak detector is communicatively coupled to RMC 222, where RMC 222 monitors any possible liquid leak within any of the server blades 410 via leak detectors 413.

According to one embodiment, electronic rack 400 further includes a server FCD coupled to at least the server supply line of at least one of the server blades 410. In this example, server FCD 403A is attached to server supply line 401A of server blade 410A and server FCD 403B is attached to server supply line 401B of server blade 410B. In this embodiment, the server FCDs are located between rack manifold 225 and server blades 410. Each of the server FCDs 403 is also communicatively coupled to RMC 222.

According to one embodiment, in response to a signal received from a leak detector of a particular server blade indicating that there may be a liquid leak within the server blade, RMC 222 is configured to send a command or signal to a server FCD corresponding to that particular server blade to reduce the amount of cooling liquid flowing into the server blade. The server blade may substantially block the cooling liquid from entering the server blade. Alternatively, the server FCD may divert the cooling liquid from a server supply line to a server return line of the server blade, bypassing the liquid distribution loop of the server blade.

For example, in response to a signal received from leak detector 413A indicating that there may be liquid leak within server blade 410A, RMC 222 transmits a command to server FCD 403A to activate or enable FCD 403A to reduce the amount of cooling liquid flowing into server blade 410A. FCD 403A may be a two-way valve or switch to simply block at least a substantial portion of the cooling liquid from entering server blade 410A via server supply line 401A. Alternatively, FCD 403A may be placed between server supply line 401A and server return line 402A (e.g., two-way valve or switch) to form a bypass path 420A. When FCD 403A is activated by RMC 222, causes at least a substantial portion of the cooling liquid to be diverted from server supply line 401A to server return line 402A. Bypass path 420A allows the cooling liquid to bypass the liquid distribution loop of server blade 410A, without entering server blade 410A.

Furthermore, server FCD 403A may be three-way valve, which can be configured in a first position and a second position. When FCD 403A is configured in a first position during the normal operations, server supply line 401A is opened to allow the cooling liquid to enter server blade 410A. When FCE 403A is configured in a second position, the server supply line to server blade 410A is closed, but the bypass path 420A is opened to allow the cooling liquid to be diverted from server supply line 401A to server return line 402A, bypassing server blade 410A. Similar operations can be applicable to other server blades such as server blade 410B.

According to another embodiment, one or more liquid pressure sensors may be utilized in addition to or in lieu of leak detectors 413 to detect the liquid leakage. For example, pressure sensor 422 may be disposed on or attached to server liquid supply line 401A to sense the liquid pressure flowing therein. When there is a leak within the liquid distribution loop, the liquid pressure on supply line 401A or return line 402A will likely drop. By detecting the liquid pressure changes, RMC can determine and respond appropriately.

In one embodiment, in response to a signal received from a pressure sensor indicating that the liquid pressure of a liquid distribution loop of a server blade drops below a predetermined threshold, RMC 222 sends a command or signal to a server FCD associated with that particular server blade. The FCD is activated to reduce an amount of cooling liquid to be distributed to the liquid distribution loop of the server blade. For example, in response to a signal received from pressure sensor 422 indicating that the liquid pressure of server liquid supply line 401A drops below a predetermined threshold, RMC 222 is configured to activate FCD 403A. In response, in one embodiment, FCD 403A is configured to substantially block the cooling liquid from entering the liquid distribution loop of server blade 410A. Alternatively, FCD 403A is configured to divert at least a substantial portion of the cooling liquid from server liquid supply line 401A to server liquid return line 402A via bypass path 420A, bypassing the liquid distribution loop of server blade 410A. Furthermore, temperature sensors may also be placed in various locations (e.g., attached to the cold plates) to detect whether there is liquid leak. When the temperature arises above a predetermined threshold or shows unusual readings, a possible liquid leak may occur.

In one embodiment, RMC 222 concurrently monitors the operating status of the liquid pressure sensors and the leak detectors of the server blades. For each of the server blades, if one of the associated leak detector and the liquid pressure sensor indicates that there may be a leak within the server blade, RMC 222 can activate the corresponding server FCD to reduce the amount of cooling liquid entering the server blade. Alternatively, RMC 222 activates the server FCD only if both the liquid pressure sensor and the leak detector indicate there is a liquid leak, where one device serves as a confirmation to the other device.

Note that a liquid pressure sensor can also be placed on a server liquid return line such as liquid return lines 402A-402B. Alternatively, a liquid pressure sensor may be placed on both a server liquid supply line and a server liquid return line of any one of the server blades 410. By individually detecting and controlling the cooling liquid distribution, each sever blade can be independently controlled, while rest of the server blades can still operate normally.

According to another aspect, a rack FCD is utilized to control the cooling liquid flow at a rack level or global level, while server FCDs operate at a server level or local level. In this example, rack FCD 415 is placed or attached to rack supply line 225A. Rack FCD 415 is configured to operate in a manner similar to server FCDs 403. According to one embodiment, in response to detecting a liquid leak in one or more of the server blades 410, RMC 222 may activate rack FCD 415 to reduce the amount of cooling liquid flowing through rack supply line 225A downstream, which in turn reduces the amount of cooling liquid reaching server blades 410. Similar to server FCDs 403, rack FCD 415 may block at least a significant or substantial amount of the cooling liquid flowing downstream within rack supply line 225A. Alternatively, rack FCD 415 may divert at least a significant or substantial amount of the cooling liquid from rack liquid supply line 225A to rack liquid return line 225B via bypass path 430, bypassing the server blades 410.

In one embodiment, RMC 222 may activate rack FCD 415 in addition to activating at least some of the server FCDs 403. Alternatively, RMC 222 may activate rack FCD 415 when a number of server blades having liquid leak is greater than a predetermined threshold. That is, initially, RMC 222 may only activate a server FCD of an individual server blade when that particular server blade has been detected with liquid leak. When a number of server blades detected having liquid leak increases more than a predetermined threshold, RMC 222 may activates rack FCD 415, in addition to activating the sever FCDs.

According to another embodiment, a liquid pressure sensor such as pressure sensor 421 may be placed on or attached to rack liquid supply line 225A and/or rack liquid return line 225B. The rack liquid pressure sensor may be utilized to detect or measure the liquid pressure of liquid flowing within rack liquid supply line 225A and/or rack liquid return line 225B as an indicator indicating whether there is any liquid leak in any of the server blades 410. The operations of rack pressure sensors may be similar to the server liquid pressure sensors as described above.

According to one embodiment, in addition to shutting down the cooling liquid to be distributed to the server blades with liquid leaking, RMC 222 may further reduce the workload or shut down the power to the server blades to prevent overheat of the IT components. The workload adjustment or power control can be performed at a server blade level or at a rack level. That is, if a particular server blade encounters liquid leak, the workload of that server blade may be reduced to reduce the chances of overheat or alternatively, the server blade may be power down, while other server blades may still operate normally.

Figure 4B:
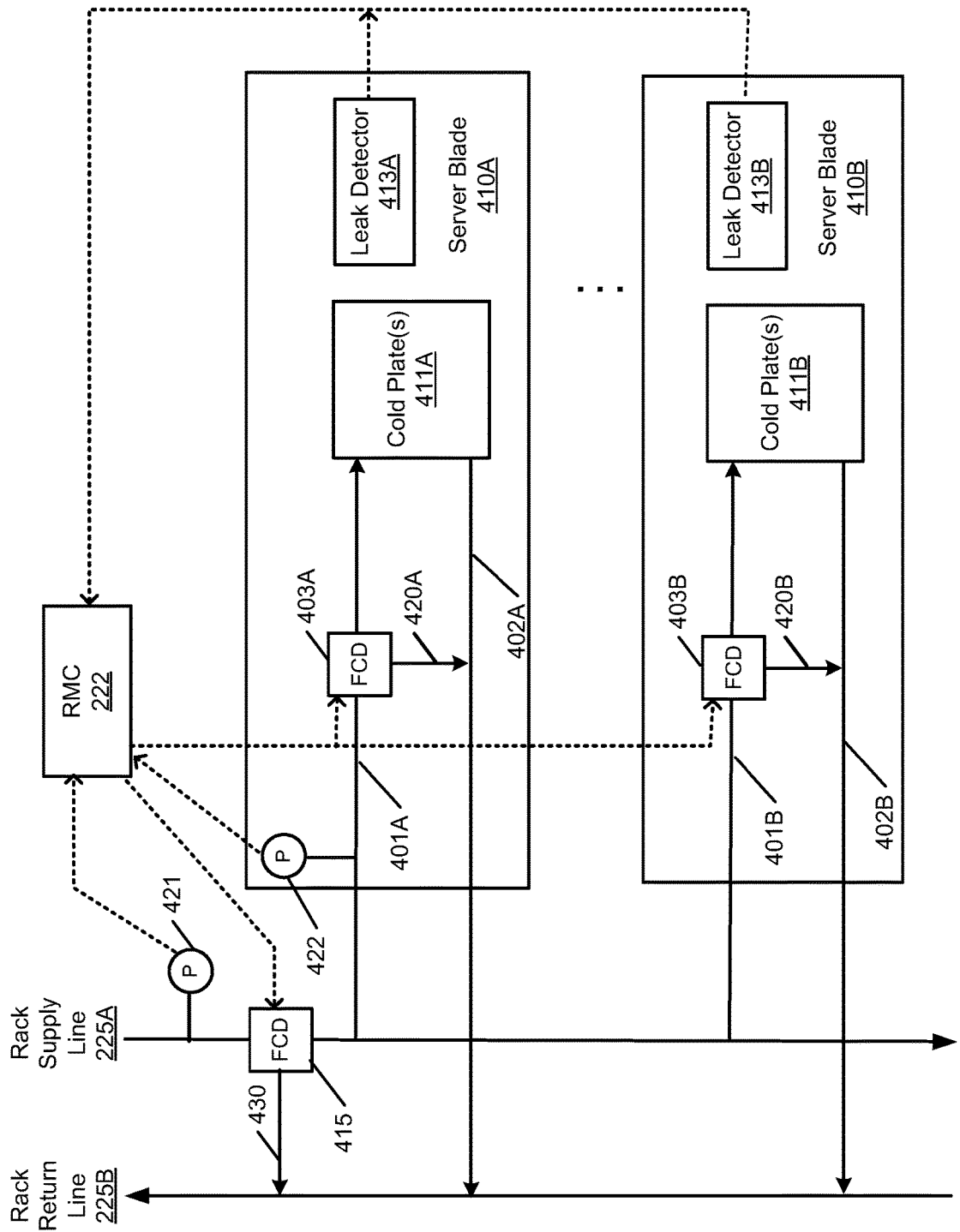

In the embodiment as shown in FIG. 4A, the server FCDs are placed between rack manifold 255 and server blades 210. Alternatively, the server FCDs may be placed within the individual server blades as shown in FIG. 4B, near or before the terminals of the liquid distribution loops of the server blades. According to a further embodiment, server FCDs may be integrated with the connectors between rack manifold 225 and server supply lines 401 and server liquid return lines 402. A sever supply line can be coupled to rack supply line 225A using a first pair of quick release connectors and a server return line can be coupled to rack return line 225B using a second pair of quick release connectors. A server FCD may be integrated as a part of or between the quick release connectors, either on the server blade side or on the rack manifold side.

Figure 5:
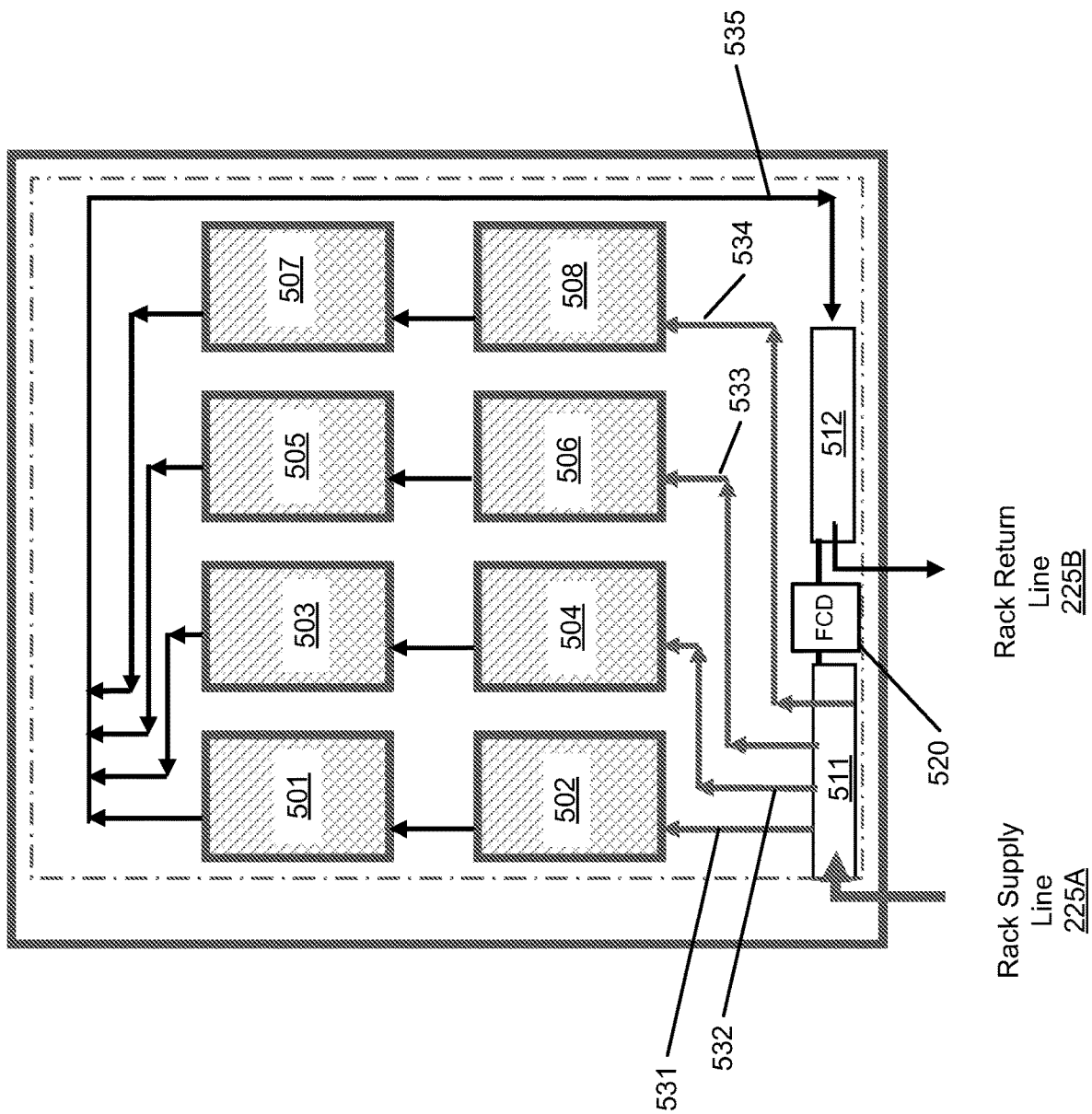
FIG. 5 is a block diagram illustrating an example of a cooling module that can be implemented as a part of a server blade according to one embodiment.

FIG. 5 is a block diagram illustrating a top view of a cooling module of a server blade according to one embodiment. Referring to FIG. 5, cooling module 500 may be implemented as a part of any of the server blades 410 of FIGS. 4A-4B. In this embodiment, cooling module 500 includes an array of cold plates 501-508. An IT component, such as a processor, can be mounted on any of the cold plates 501-508. In this example, at least some of the cold plates are cascaded or chained in series. However, the configuration or arrangement of the cold plates 501-508 is shown for the illustration only. Other configurations may exist.

According to one embodiment, since there are multiple chains of cold plates, there are multiple liquid distribution loops formed, one for each of the chains. In this example, there are four chains: cold plates 501-502, cold plates 503-504, cold plates 505-506, and cold plates 507-508. For each of the chains, there is a liquid distribution loop formed, i.e., liquid distribution loops 531-534, which share a common return line 535. The liquid distribution loops 531-534 are coupled to a server manifold having a server supply manifold 511 and a server return manifold 512. In addition, one or more leak detectors and/or sensors (e.g., temperature sensors) may be placed in various locations within cooling module 500 to detect liquid leak.

In one embodiment, a server FCD 520 is coupled between server supply manifold 511 and server return manifold 512. Server FCD 520, when activated, can divert a substantial portion of the cooling liquid from server supply manifold 511 to server return manifold 512, bypassing liquid distribution loops 531-534 and cold plates 501-508, as described above. According to another embodiment, an additional FCD may be attached to one or more of the liquid distribution loops 531-534 to control the cooling liquid flows of the individual liquid distribution loops. Furthermore, according to a further embodiment, one or more liquid pressure sensors can also be coupled to server supply manifold 511, server return manifold 512, and/or individual liquid distribution loops 531-534. The liquid pressure sensors can be utilized to detect the liquid pressures of the cooling liquid as an indicator whether there is liquid leak, as described above. Alternatively, temperature sensors (not shown) may also be placed in various locations (e.g., attached to the cold plates) to detect whether there is liquid leak. When the temperature arises above a predetermined threshold, a possible liquid leak may occur.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An electronic rack, comprising:
a rack manifold having a rack liquid supply line to receive cooling liquid from a cooling liquid source and a rack liquid return line to return warmer liquid back to the cooling liquid source;
a plurality of server blades arranged in a stack, wherein each server blade of the plurality of server blades includes one or more cold plates associated with one or more information technology (IT) components and a server liquid distribution loop to receive the cooling liquid from the rack manifold and to distribute the cooling liquid to the cold plates to exchange heat generated from the IT components, transforming the cooling liquid into the warmer liquid, wherein each server blade of the plurality of server blades further includes a leak detector configured to detect leaking of the cooling liquid distributed to a corresponding server blade of the plurality of server blades;
a plurality of pairs of server liquid supply lines and server liquid return lines, each pair corresponding to one server blade of the plurality of server blades, wherein the server liquid supply lines and the server liquid return lines are coupled between the rack manifold and the server liquid distribution loops of each server blade of the plurality of server blades;
a plurality of server flow control devices (FCDs), each corresponding to one of the pairs of server liquid supply lines and the server liquid return lines, including a first server FCD coupled to a first pair of a first server liquid supply line and a first server liquid return line of a first server blade, each server FCD of the plurality of server FCDs being disposed on a corresponding server liquid supply line and a corresponding server liquid return line, the each server FCD being a three-way valve having a first position and a second position, wherein the each server FCD is configured to divert the cooling liquid from the corresponding server liquid supply line to the corresponding server liquid return line, bypassing only a corresponding liquid distribution loop of the corresponding server blade of the plurality of server blades;
a rack management controller (RMC) unit coupled to the server FCDs and leak detectors of the plurality of server blades, wherein in response to a signal received from a first leak detector of the first server blade indicating liquid leak within the first server blade, the RMC is configured to transmit a control signal to the first server FCD to reduce an amount of the cooling liquid distributed to the first server blade, wherein the first server FCD is configured to block substantially all cooling liquid to be distributed to a first liquid distribution loop of the first server blade, and wherein the first server FCD is configured to divert the cooling liquid from the first server liquid supply line to the first server liquid return line, bypassing the first liquid distribution loop of the first server blade; and
a coolant distribution unit (CDU) including a heat exchanger being provided in the electronic rack, wherein the heat exchanger includes a first loop and a second loop, the first loop having a first pair of liquid connectors coupled to an external liquid supply line and an external liquid return line to form the first loop, the second loop having a second pair of liquid connectors coupled to each of the plurality of server FCDs to form the second loop.

2. The electronic rack of claim 1, wherein each server blade further includes a supply liquid pressure sensor disposed on the server liquid supply line, and wherein in response to a signal received from a supply liquid pressure sensor of a second server blade indicating that a liquid pressure of a second server liquid supply line of the second server blade drops below a predetermined threshold, the RMC is configured to cause a second server FCD of the second server blade to reduce an amount of the cooling liquid to be distributed to the second server liquid supply line.

3. The electronic rack of claim 2, wherein each server blade of the plurality of server blades further includes a return liquid pressure sensor disposed on the server liquid return line, and wherein in response to a signal received from a return liquid pressure sensor of a second server blade indicating that a liquid pressure of a second server liquid return line of the second server blade drops below a predetermined threshold, the RMC is configured to cause a second server FCD of the second server blade to reduce an amount of the cooling liquid to be distributed to the second server liquid supply line.

4. The electronic rack of claim 1, further comprising a rack FCD coupled to the rack liquid supply line, wherein the rack FCD is configured to control an amount of the cooling liquid to be distributed to the plurality of server blades.

5. The electronic rack of claim 4, wherein in response to a command received from the RMC unit, the rack FCD is configured to block a substantial amount of the cooling liquid to reach the plurality of server blades.

6. The electronic rack of claim 5, wherein the rack FCD is configured to divert the substantial amount of the cooling liquid from the rack liquid supply line to the rack liquid return line, bypassing the plurality of server blades.

7. The electronic rack of claim 4, further comprising a first rack liquid pressure sensor coupled to the rack liquid supply line to sense a liquid pressure within the rack liquid supply line, wherein the RMC unit activates the rack FCD to reduce the amount of cooling liquid to reach the plurality of server blades, in response to receiving a first signal from the first rack liquid pressure sensor indicating that the liquid pressure drops below a first predetermined threshold.

8. The electronic rack of claim 7, further comprising a second rack liquid pressure sensor coupled to the rack liquid return line to sense a liquid pressure within the rack liquid return line, wherein the RMC unit activates the rack FCD to reduce the amount of cooling liquid to reach the plurality of server blades, in response to receiving a second signal from the second rack liquid pressure sensor indicating that the liquid pressure drops below a second predetermined threshold.

9. An electronic rack of a data center, comprising:
a rack manifold having a rack liquid supply line to receive cooling liquid from a cooling liquid source and a rack liquid return line to return warmer liquid back to the cooling liquid source;
a plurality of server blades arranged in a stack, wherein each server blade of the plurality of server blades includes one or more cold plates associated with one or more information technology (IT) components and a server liquid distribution loop to receive the cooling liquid from the rack manifold and to distribute the cooling liquid to the cold plates to exchange heat generated from the IT components, transforming the cooling liquid into the warmer liquid, wherein at least one server blade of the plurality of server blades further includes a leak detector configured to detect leaking of the cooling liquid distributed to the at least one server blade;

a rack flow control device (FCD) connected to the rack liquid supply line and the rack liquid return line, the rack FCD being disposed on the rack liquid supply line and the rack liquid return line, wherein the rack FCD is configured to divert the cooling liquid from the rack liquid supply line to the rack liquid return line, bypassing the plurality of server blades;

a rack management controller (RMC) unit coupled to the rack FCD and the leak detector of the at least one server blade of the plurality of server blades, wherein in response to a signal received from the leak detector of the at least one server blade of the plurality of server blades indicating that there is liquid leak, the RMC is configured to transmit a control signal to the rack FCD to reduce an amount of the cooling liquid to reach the plurality of server blades;

wherein each server blade of the plurality of server blades comprises a server fluid control device (FCD) coupled to a server supply line and a server return line of a corresponding server liquid distribution loop; and a coolant distribution unit (CDU) including a heat exchanger being provided in the electronic rack, wherein the heat exchanger includes a first loop and a second loop, the first loop having a first pair of liquid connectors coupled to an external liquid supply line and an external liquid return line to form the first loop, the second loop having a second pair of liquid connectors coupled to each of the plurality of server FCDs to form the second loop.

10. The electronic rack of claim 9, wherein the rack FCD comprises a valve coupled to the rack liquid supply line and the rack liquid return line, and wherein in response to the liquid leak, the RMC unit causes the valve to be opened to divert the cooling liquid from the rack liquid supply line to the rack liquid return line, bypassing the plurality of server blades.

11. The electronic rack of claim 9, wherein the rack FCD comprises a valve disposed on the rack liquid supply line, and wherein in response to the liquid leak, the RMC unit causes the valve to be closed to prevent the cooling liquid from entering the server liquid distribution loops of each server blade of the plurality of server blades.

12. The electronic rack of claim 9, wherein the rack FCD comprises a 2-way valve, wherein when the 2-way valve is configured in a first position, the cooling liquid is allowed to enter the server liquid distribution loops of the plurality of server blades, and wherein when the 2-way valve is configured in a second position, the cooling liquid is diverted from the rack liquid supply line to the rack liquid return line, bypassing the server liquid distribution loops of the plurality of server blades.

13. The electronic rack of claim 9, further comprising a first rack liquid pressure sensor coupled to the RMC unit and the rack liquid supply line, wherein in response to a first signal received from the first rack liquid pressure sensor indicating that the liquid pressure drops below a first predetermined threshold, the RMC unit is configured to activate the rack FCD to divert the cooling liquid from the rack liquid supply line to the rack liquid return line.

14. The electronic rack of claim 13, further comprising a second rack liquid pressure sensor coupled to the RMC unit and the rack liquid return line, wherein in response to a second signal received from the second rack liquid pressure sensor indicating that the liquid pressure of the cooling liquid drops below a second predetermined threshold, the RMC unit is configured to activate the rack FCD to divert the cooling liquid from the rack liquid supply line to the rack liquid return line.

15. The electronic rack of claim 9, wherein each of the plurality of server FCDs, when activated, is configured to reduce a substantial amount of the cooling liquid to be distributed to the corresponding server liquid distribution loop of a corresponding server blade of the plurality of server blades.

16. The electronic rack of claim 15, wherein in response to a signal received from a first leak detector of a first server blade of the plurality of server blades indicating there is liquid leak within the first server blade, the RMC unit is configured to activate a first server FCD of the first server blade to prevent a substantial amount of the cooling liquid from entering a first server liquid distribution loop of the first server blade.

17. The electronic rack of claim 16, wherein the first server blade further comprises a first liquid pressure sensor disposed on the first server liquid distribution loop, and wherein in response to a signal received from the first liquid pressure sensor indicating that a liquid pressure of the first server liquid distribution loop drops below a predetermined threshold, the RMC unit is configured to activate the first server FCD.

18. The electronic rack of claim 16, wherein the RMC unit is configured to activate the first server FCD of the first server blade to divert a substantial amount of the cooling liquid from a first server liquid supply line to a first server liquid return line, bypassing the first liquid distribution loop of the first server blade.

* * * * *